(12) United States Patent
Maejima

(10) Patent No.: US 8,345,460 B2
(45) Date of Patent: *Jan. 1, 2013

(54) SEMICONDUCTOR MEMORY DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/347,344

(22) Filed: Jan. 10, 2012

(65) Prior Publication Data

US 2012/0106230 A1 May 3, 2012

Related U.S. Application Data

(63) Continuation of application No. 12/556,299, filed on Sep. 9, 2009, now Pat. No. 8,111,536.

(30) Foreign Application Priority Data

Nov. 21, 2008 (JP) .................................. 2008-297468

(51) Int. Cl.
*G11C 5/06* (2006.01)
(52) U.S. Cl. ........................ 365/63; 365/148; 365/206
(58) Field of Classification Search .................. 365/63, 365/148, 206, 211, 158, 171, 173, 201, 51
See application file for complete search history.

(56) References Cited

U.S. PATENT DOCUMENTS

| 6,621,730 | B1 | 9/2003 | Lage | |
|---|---|---|---|---|
| 7,133,322 | B2 | 11/2006 | Adelmann | |
| 7,570,511 | B2 * | 8/2009 | Cho et al. | 365/163 |
| 7,619,917 | B2 * | 11/2009 | Nirschl et al. | 365/180 |
| 8,111,536 | B2 * | 2/2012 | Maejima | 365/63 |
| 2003/0103404 | A1 * | 6/2003 | Zheng et al. | 365/225.5 |
| 2009/0323407 | A1 | 12/2009 | Williams et al. | |
| 2010/0165702 | A1 * | 7/2010 | Toda | 365/148 |

FOREIGN PATENT DOCUMENTS

| JP | 2002-541613 | 12/2002 |
|---|---|---|
| WO | WO 00/62301 | 10/2000 |

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

The memory cell array has memory cells each positioned at respective intersections between a plurality of first wirings and a plurality of second wirings. Each of the memory cells has a rectifier element and a variable resistance element connected in series. The resistance element may have at least a first resistance value and a second resistance value higher than the first resistance value. The contact arrangement portion is formed to arrange a plurality of contacts on a plane. The contacts are connected to the first wirings or the second wirings. The probe can move along the plane to electrically contact with either of the contacts.

17 Claims, 8 Drawing Sheets

US 8,345,460 B2

SEMICONDUCTOR MEMORY DEVICE

CROSS REFERENCE TO RELATED APPLICATIONS

This application is a continuation of U.S. Ser. No. 12/556,299 filed Sep. 9, 2009 which is based on and claims the benefit of priority from prior Japanese Patent Application No. 2008-297468, filed on Nov. 21, 2008, the entire contents of each of which are incorporated herein by reference.

BACKGROUND OF THE INVENTION

1. Field of the Invention

The present invention relates to a semiconductor memory device.

2. Description of the Related Art

Resistance change memory has attracted increased attention as a likely candidate for replacing flash memory. As described herein, it is assumed that the resistance change memory devices include Resistive RAM (ReRAM), in a narrow sense, that uses a transition metal oxide as a recording layer and stores its resistance states in a non-volatile manner, as well as Phase Change RAM (PCRAM) that uses chalcogenide, etc., as a recording layer to utilize the resistance information of crystalline states (conductors) and amorphous states (insulators).

It is known that the variable resistance elements in resistance change memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see, Japanese Unexamined Patent Publication No. (Kohyo) 2002-541613).

In an arrangement of a plurality of laminated crosspoint-type memory cell arrays, selection transistors need to be connected to many word lines and many bit lines. Accordingly, the area occupied by such selection transistors becomes large in a periphery of the memory cell arrays. This is regarded as a problem.

SUMMARY OF THE INVENTION

One aspect of the present invention provides a semiconductor memory device comprising a memory cell array having memory cells each positioned at respective intersections between a plurality of first wirings and a plurality of second wirings, each of the memory cells having a rectifier element and a variable resistance element connected in series, the resistance element being configured to be capable of having at least a first resistance value and a second resistance value higher than the first resistance value; a wiring pullout portion prepared for pulling out the first wirings and the second wirings; a contact arrangement portion formed to arrange a plurality of contacts on a plane, the contacts being connected to the first wirings or the second wirings; and a probe that can move along the plane to electrically contact with either of the contacts.

DETAILED DESCRIPTION OF THE EMBODIMENTS

Embodiments of the present invention will now be described below with reference to the accompanying drawings. In the disclosed embodiments, a semiconductor memory device is described as a resistance change memory device having a three-dimensional memory cell array structure with laminated memory cell arrays. Of course, this configuration, however, is intended to be exemplary only, and not a limitation upon the present invention.

[Basic Configuration]

Figure 1:
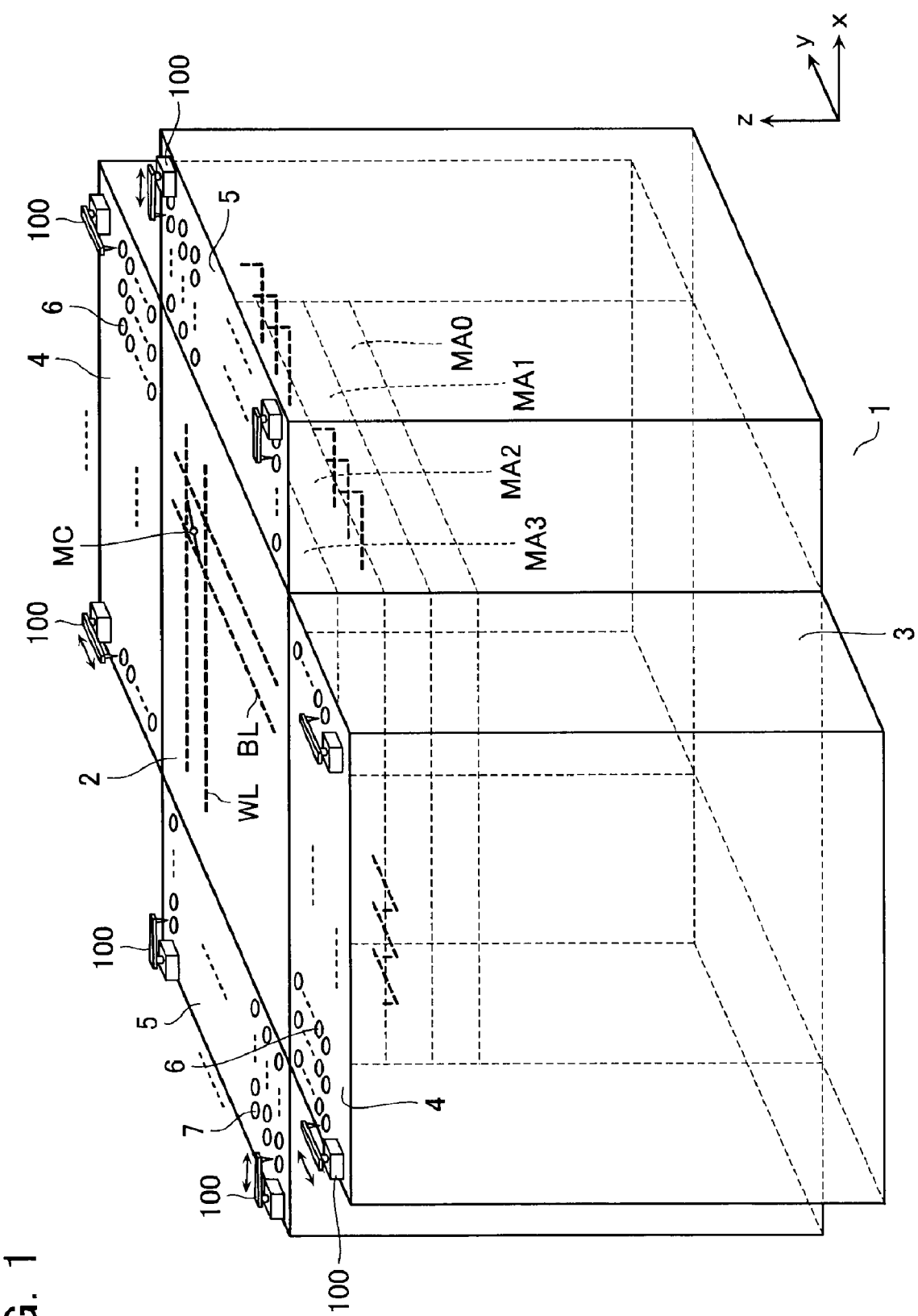
FIG. 1 is a perspective view illustrating a configuration of a resistance change memory device according to an embodiment.

FIG. 1 illustrates a basic configuration of a resistance change memory device according to an embodiment of the present invention, i.e., configuration of a peripheral circuit region 3, in which wirings such as global buses are formed on a semiconductor substrate 1, and a memory block 2 laminated thereon.

As shown in FIG. 1, the memory block 2 is formed by laminating plural memory cell arrays MA. In the example shown in FIG. 1, the memory block 2 includes four layers of memory cell arrays MA0 to MA3. Each of the memory cell arrays MA includes a plurality of word lines WL and a plurality of bit lines BL intersecting with the word lines WL, and memory cells arranged at intersections of the word lines WL and the bit lines BL.

The peripheral circuit region 3 is provided on the semiconductor substrate 1 immediately below the memory block 2. As described below, a column control circuit and a row control circuit may also be provided on the peripheral circuit region 3.

Bit line contact regions 4 and word line contact regions 5 are provided on four sides of the memory block 2. The bit line contact regions 4 and the word line contact regions 5 serve as wiring pullout portion for pulling out the bit lines BL and the word lines WL. The surfaces of the bit line contact regions 4 and the word line contact regions 5 serve as contact arrangement portions for forming bit line contacts 6 and word line contacts 7 connected to the bit lines BL and the word lines WL.

Figure 2:
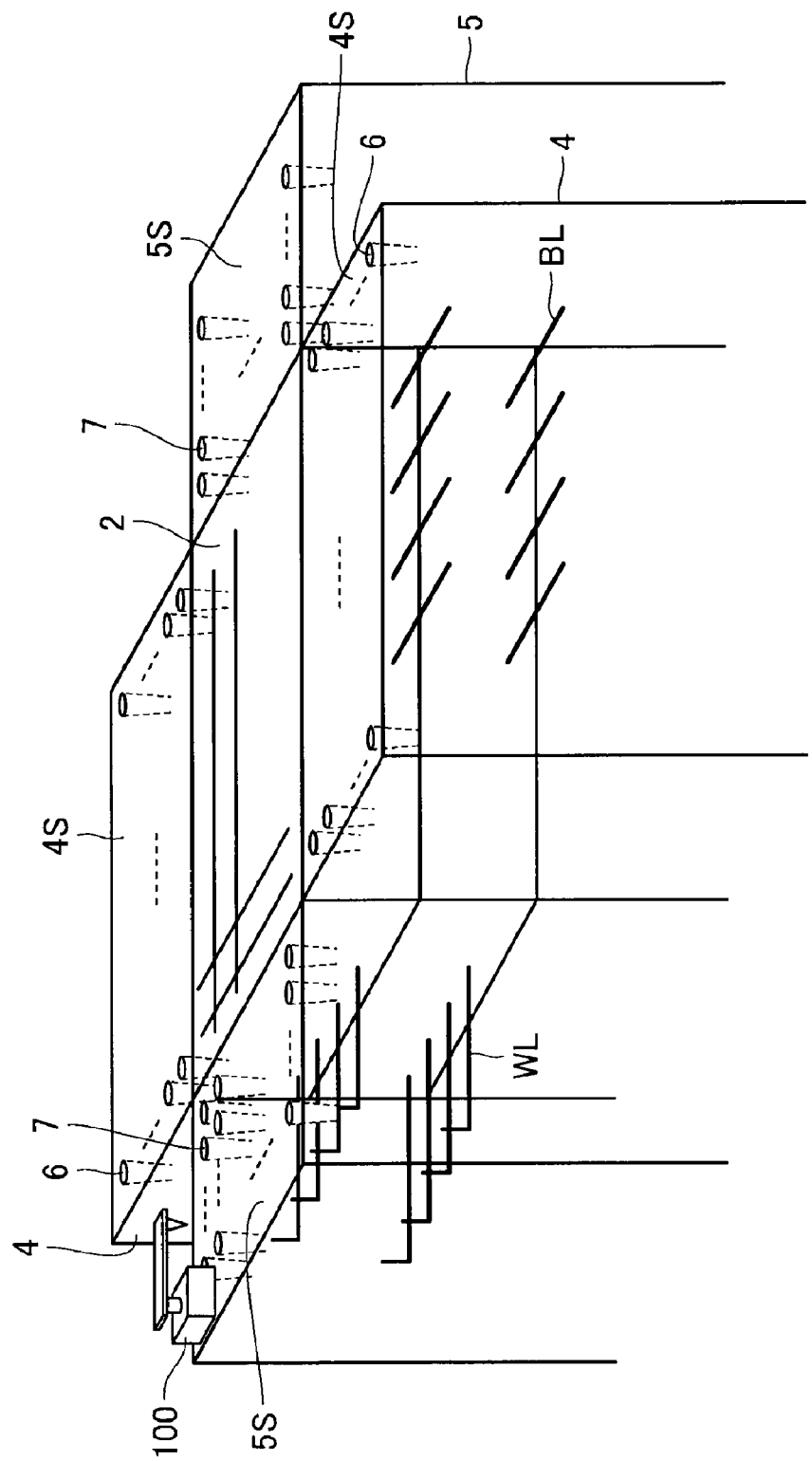
FIG. 2 is a perspective view illustrating a configuration of a bit line contact 6 and word line contact 7.

As shown in FIG. 2, The bit line contacts 6 and the word line contacts 7 are exposed to external at the top layer of the bit line contact region 4 and the word line contact regions 5, i.e., at planes 4S and 5S that are parallel to the semiconductor substrate 1. The bit line contacts 6 and the word line contacts 7 are arranged on the planes 4S and 5S, and are electrically contacted by a probe member 100 that can move a cantilever along these planes 4S and 5S. The bit line contacts 6 and the word line contacts 7 are electrically connected to the peripheral circuit region 3 via the probe member 100.

[Configuration of Memory Cell Array MA]

Figure 3:
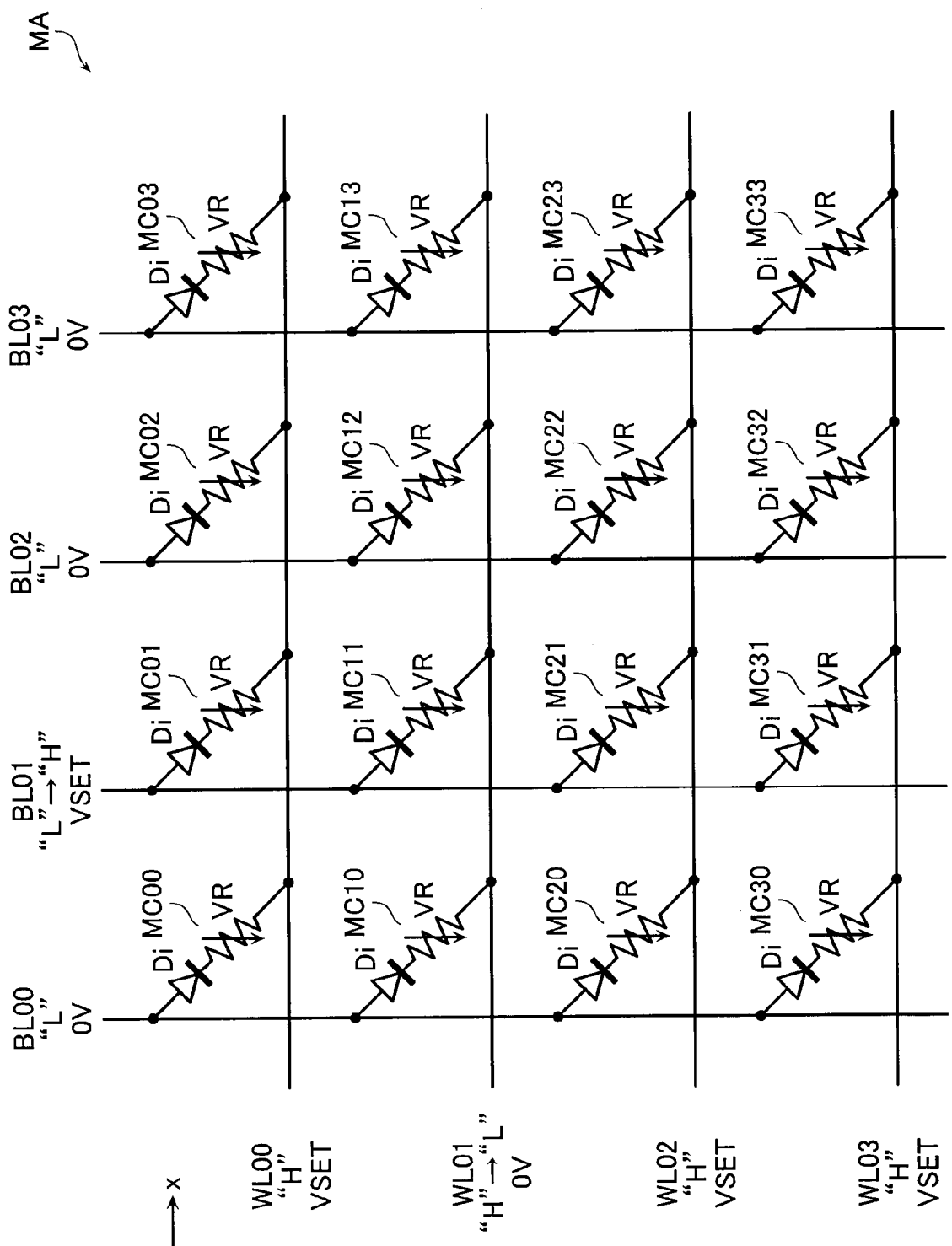
FIG. 3 is an equivalent circuit diagram of a memory cell array MA in the resistance change memory device according to the embodiment.

FIG. 3 is an equivalent circuit diagram of a memory cell array MA in the resistance change memory device. In this case, the memory cell array MA illustrated in FIG. 3 has a plurality of unit memory cells MC arranged in a longitudinal direction to the bit lines BL (the y direction of FIG. 2) as well as in another longitudinal direction to the word lines WL (the x direction of FIG. 2), respectively, in a two dimensional matrix form. A plurality of the memory cell arrays MA are laminated to form the memory block 2.

As illustrated in FIG. 3, resistance-varying type unit memory cells MC are positioned at intersections between word lines WL and bit lines BL, with rectifier elements, e.g., diodes Di, and variable resistance elements VR connected in series. It should be noted that the arrangement and polarity of the diodes Di and the variable resistance elements VR included in the memory cells MC are not limited to the illustrated ones.

The variable resistance elements VR, which have, for example, a structure of electrode/transition metal oxide/electrode, provide a change in resistance value of metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence of presence of charges trapped by a charge trapping residing on the electrode interface; and the other is the type where a resistance change occurs depending on the absence or presence of a conductive path due to oxygen defect, etc.); and so on.

For unipolar-type ReRAM, data is written to a memory cell MC by applying, for on the order of 10 ns to 100 ns, a voltage of, e.g., 3.5V (in fact, on the order of 4.5V including a voltage drop in the corresponding diode Di) and a current of on the order of 10 nA to a variable resistance element VR. As a result, the variable resistance element VR changes from a high resistance state to a low resistance state. The operation of changing a variable resistance element VR from a high resistance state to a low resistance state is hereinafter referred to as the "setting operation".

On the other hand, data is erased from a memory cell MC by applying, for on the order of 500 ns to 2 μs, a voltage of 0.8V (in fact, on the order of 1.8V including a voltage drop in the corresponding diode Di) and a current of on the order of 1 μA to 10 μA to a variable resistance element VR in its low resistance state after the setting operation. As a result, the variable resistance element VR changes from a low resistance state to a high resistance state. The operation of changing a variable resistance element VR from a low resistance state to a high resistance state is hereinafter referred to as the "reset operation".

For example, memory cell MC takes a high resistance state as a stable state (reset state) and data is written to each memory cell MC by such a setting operation that causes a reset state to be switched to a low resistance state for binary storage.

A read operation from a memory cell MC is performed by applying a voltage of 0.4V (in fact, on the order of 1.4 V including a voltage drop in the corresponding diode Di) to a variable resistance element VR and monitoring a current flowing through the variable resistance element VR. As a result, it is determined whether the variable resistance element VR is in its low resistance or high resistance state.

[Setting Operation]

Referring to FIG. 3, the setting operation of the resistance change memory device according to this embodiment will be described below. FIG. 3 illustrates the states of voltage applied to the bit lines BL and the word lines WL connected to a memory cell array MA in a setting operation of a memory cell MC. In this case, given that the selected memory cell MC to which data is to be written by the setting operation is MC11.

Non-selected bit lines BL00, BL10, and BL11 that are not connected to the selected memory cell MC11 are in "L" state (in this embodiment, Vss=0V). During the setting operation, the selected bit line BL01 that is connected to the selected memory cell MC11 is driven from "L" state (Vss=0V) to "H" state (in this embodiment, voltage VSET). In addition, non-selected word lines WL00, WL02, and WL03 that are not connected to the selected memory cell MC11 are in "H" state (in this embodiment, voltage VSET). During the setting operation, the selected word line WL01 that is connected to the selected memory cell MC11 is driven from the "H" state (voltage VSET) to "L" state (in this embodiment, voltage Vss=0V) . As a result, the diode Di in the selected memory cell MC11 is turned to a forward-biased state, which causes current to flow therethrough. Then a potential difference VSET is applied to the selected memory cell MC11 and the corresponding variable resistance element VR change s from a high resistance state to a low resistance state, after which the setting operation is completed.

[Reset Operation]

Figure 4:
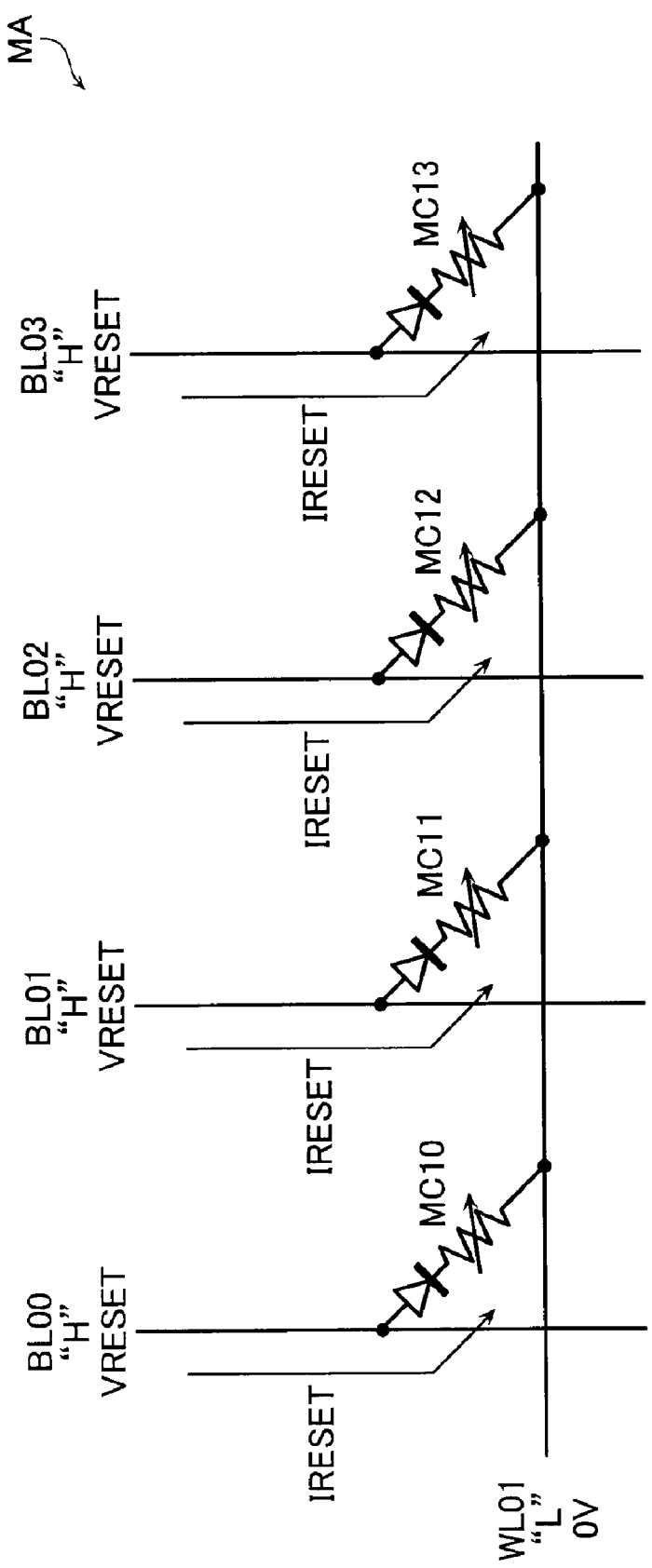
FIG. 4 illustrates a reset operation in the resistance change memory device according to the embodiment.

Referring now to FIG. 4, reset operations of the resistance change memory device will be described below.

In reset operation, the selected bit lines BL00 to BL11 that are connected to the selected memory cells MC10 to MC13 are driven to "H" state (in this embodiment, voltage VRESET). In this reset operation, the selected word line WL01 that is connected to the selected memory cells MC10 to MC13 is also driven to "L" state (in this embodiment, voltage Vss=0V). In this case, non-selected word lines WL00, WL02, and WL03 that are not connected to the selected memory cells MC10 to MC13 are in "H" state (e.g., voltage VRESET). Further, the reset voltages VRESET being applied to the bit lines BL00 to BL11 are such standard voltages that allow the variable resistance elements VR in the memory cells MC to change from low resistance states to high resistance states, respectively.

Upon voltage being applied to the selected bit lines BL00 to BL03, the diodes Di in the selected memory cells MC10 to MC03 are forward biased and current flows therethrough. A reset current IRESET flows through each of the memory cells MC that allows for a reset operation. Due to the reset voltages VRESET and the reset currents IRESET applied to the bit lines BL00 to BL11 , the corresponding variable resistance elements VR change from low resistance states to high resistance states, after which the reset operations are completed.

[Configuration of Control Circuit]

Figure 5:
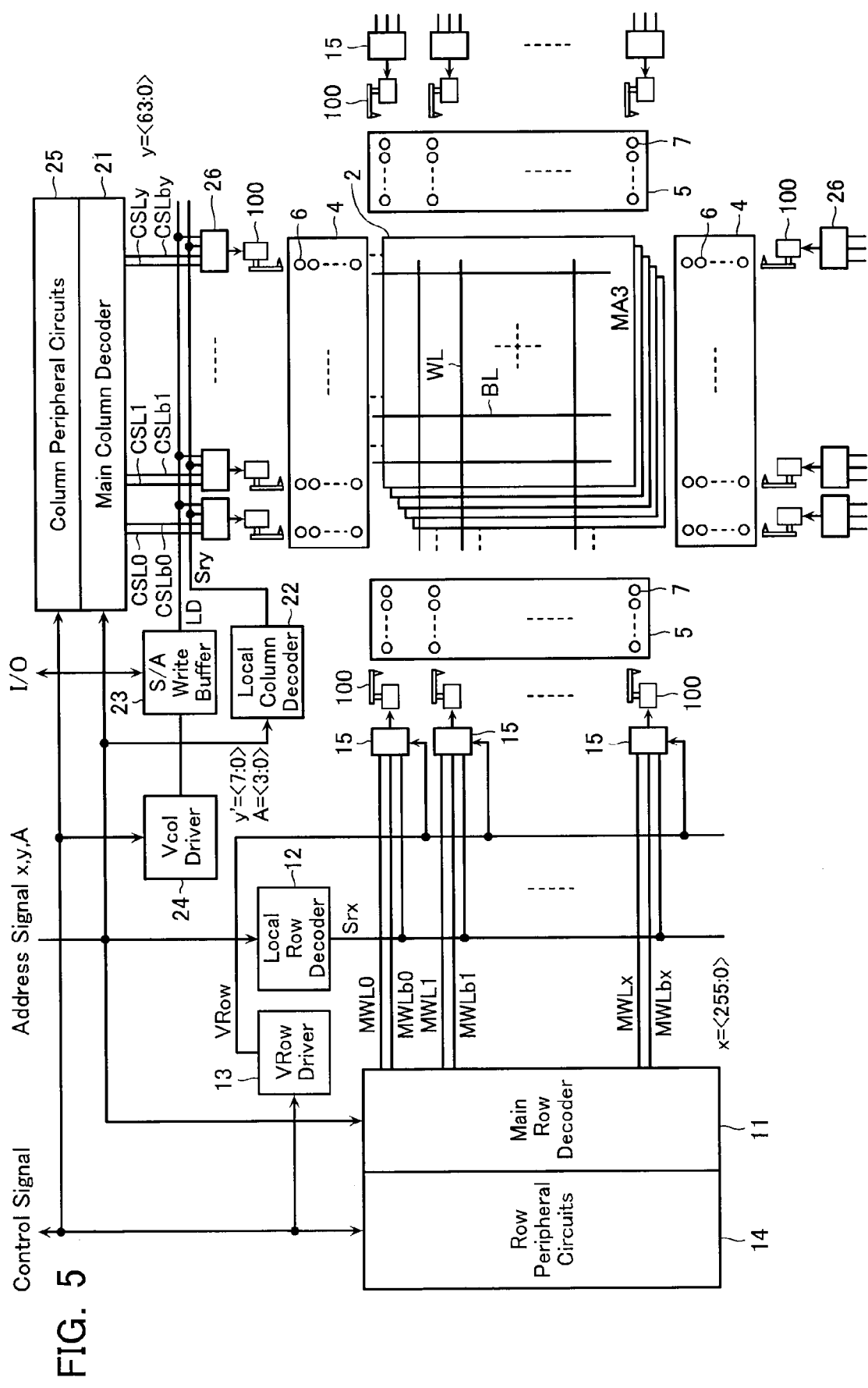
FIG. 5 is a block diagram illustrating an example arrangement of the resistance change memory device according to the embodiment.

A circuit configuration of the resistance change memory device will be described with reference to FIGS. 5. In the memory cell array MA of FIG. 5, for example, 2K-bit (2048) unit memory cells MC are arranged in the longitudinal direction of the bit line BL, and 512-bit unit memory cells MC are arranged in the longitudinal direction of the word line WL. Therefore, the case in which 1M-bit (about $10^6$) unit memory cells MC are arranged in the one memory cell array MA will be described by way of example. In this example, 4 layers of memory cell array MA0-3 are formed in the device. Thus, 4-Mbits memory cells are arranged in the device. FIG. 5 is a block diagram illustrating an example of the arrangement of a column control circuit and a row control circuit in the resistance change memory device.

Referring to FIG. 5, the row control circuit includes a main row decoder 11, a local row decoder 12, a row power-supply line driver 13, and a row-system peripheral circuit 14, and row-system probe driver 15.

The column control circuit includes a main column decoder 21, a local column decoder 22, a sense amplifier/write buffer 23, a column power-supply line driver 24, a column-system peripheral circuit 25, and a column-system probe driver 26.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. In contrast, in the non-selected main word lines MWLx and MWLbx, the main word line MWLx becomes the "L" state and the main word line MWLbx becomes the "H" state.

One pair of main word lines MWLx and MWLbx is connected to one row-system probe driver 15. The row-system probe driver 15 selectively causes the probe member 100 to be contacted to a word line contact 7 connected to one word line in a word line group under the hierarchical structure of the main word lines MWLx and MWLbx. The local row decoder 12 outputs, based on a lower bit x'=<7:0> of an address signal and a selection signal A=<3:0> for selecting either one of the memory cell arrays MA0-3, a selection signal Srx for selecting either one of the lower word line WL under the selected main word lines MWLx, MBLbx.

The row power-supply line driver 13 is a driver for providing a drive line VRow with various types of voltages to be supplied to the selected word lines WL. The voltages provided to the drive line VRow are applied to each of the word lines WL via the row-system probe driver 15 and a probe member 100.

The row-system peripheral circuit 14 manages the whole of the resistance change memory device. The row-system peripheral circuit 14 receives a control signal from an external host apparatus. The row-system peripheral circuit 14 reads, write, and erases the data. In addition, the row-system peripheral circuit 14 performs data input and output management.

The bit line BL of the embodiment also has the hierarchical structure, and the main column decoder 21 selectively drives a pair of main column selection lines CSLy and CSLby from among 256 pairs of the main column selection lines CSLy and CSLby (y=<255:0>). For example, in the selected main column selection lines CSLy and CSLby, the main column selection line CSLy becomes the "H" state and the main column selection line CSLby becomes the "L" state. In contrast, in the non-selected main column selection lines CSLy and CSLby, the main column selection line CSLy becomes the "L" state and the main column selection line CSLby becomes the "H" state.

One pair of column selection lines CSLy and CSLby is connected to a column-system probe driver 26. The column-system probe driver 26 selectively causes the probe member 100 to be contacted to a bit line contact 6 connected to one bit line in a bit line group under the hierarchical structure of the main column selection lines CSLy and CSLby.

The sense amplifier/write buffer 23 temporarily holds write data provided via data input/output lines I/O. In addition, the sense amplifier/write buffer 23 is provided with a voltage depending on the write data from the column power-supply line driver 24, and provide the voltage to the bit line contact 6 via the column-system probe driver 26 and the probe member 100.

Furthermore, the column-system peripheral circuit 25 manages the whole of the resistance change memory device. The column-system peripheral circuit 25 receives a control signal from an external host apparatus. The column-system peripheral circuit 14 reads, write, and erases the data. In addition, the column-system peripheral circuit 25 performs data input and output management.

[Structure of Bit line Contact Region 4]

Figure 6:
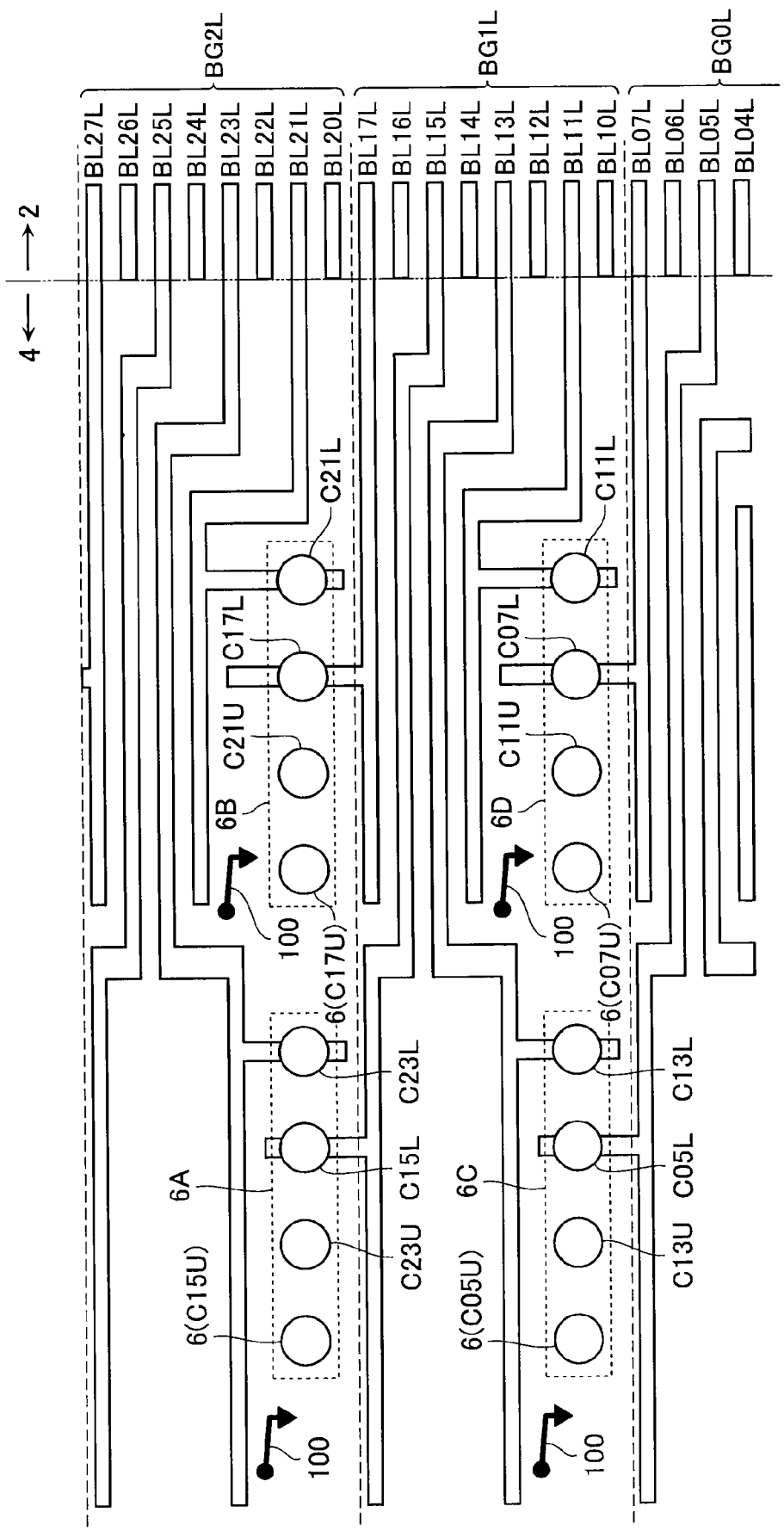
FIG. 6 illustrates a wiring diagram showing a specific wiring configuration of the bit line contact region 4.
Figure 7:
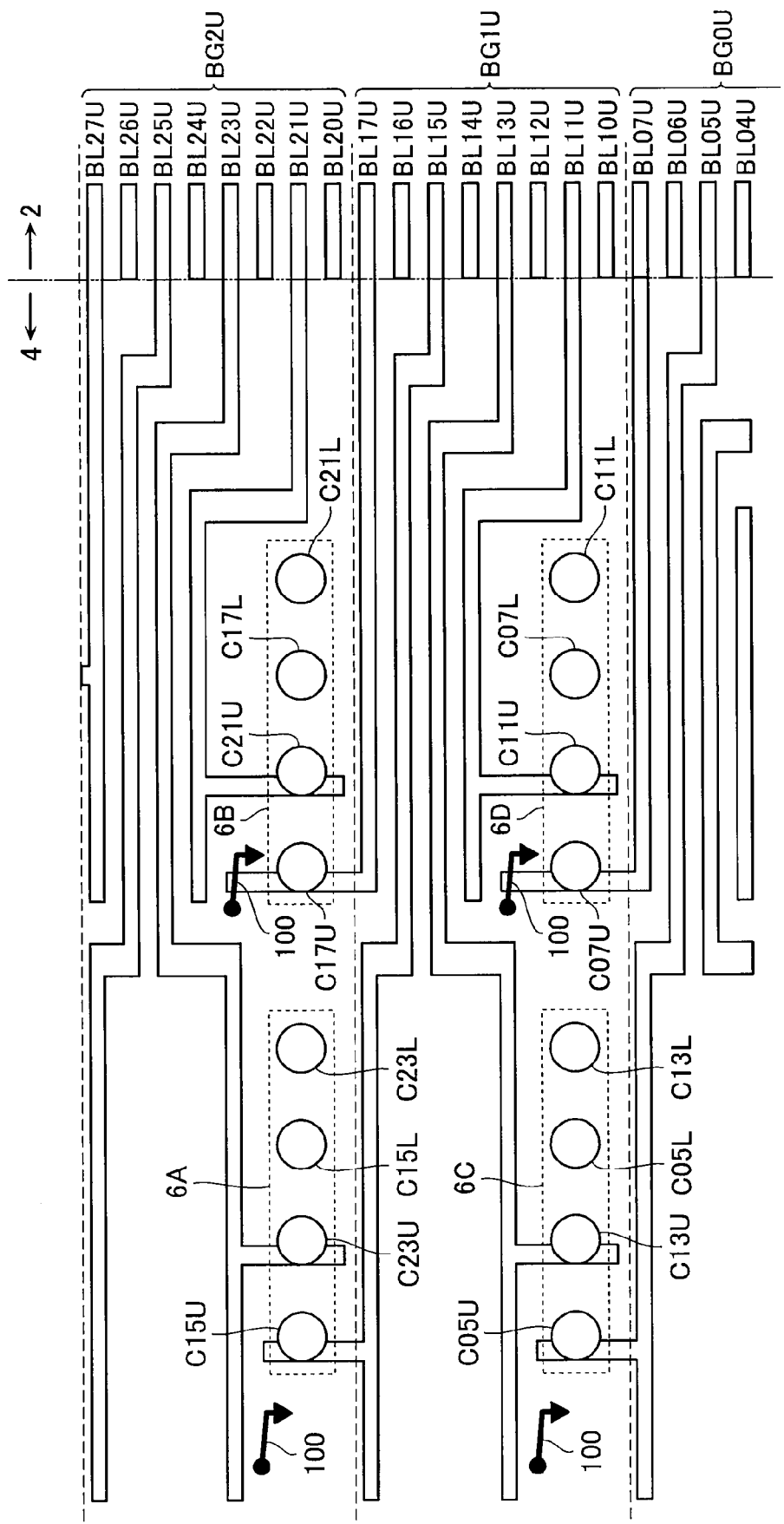
FIG. 7 illustrates a wiring diagram showing a specific wiring configuration of the bit line contact region 4.

Referring now to FIGS. 6 and 7, a specific structure example of the bit line contact region 4 is described below. Since the word line contact regions 5 has the same structure as the bit line contact region 4, only the bit line contact region 4 is described below.

In this example, among the laminated plural memory cell arrays MA0-3, the even-numbered memory cell arrays MA0 and MA2 share the same bit line contact 6. Likewise, the odd numbered memory cell array MA1 and MA3 share the same bit line contact 6. This is just an example. Each of all bit lines may be connected to an individual bit line contact 6, respectively.

FIG. 6 shows a planar wiring structure (the XY plane of FIG. 1) in the lower memory cell array MA2. FIG. 7 shows a planar wiring structure in the memory cell array MA3 of the upper layer than the memory cell array MA2.

Note that, in FIG. 6, each of the bit lines BL of the memory cell array MA2 is provided with a symbol such as "BLyL", in order to clarify that it is in the lower layer (L: lower). Likewise, in FIG. 7, each of the bit lines BL of the memory cell array MA3 is provided with a symbol such as "BLyU", in order to clarify that it is in the upper layer (U: upper).

As shown in FIG. 6, eight bit line BLyL forms one bit line group BGiL in the lower memory cell array MA2 (e.g., one bit line group BG0L includes bit lines BL10-17, and another bit line group BG1L includes bit lines BL20-27). Among the bit line group BG0L, odd-numbered bit lines BLyL (e.g., BL11L, BL13L, BL15L, BL17L) are drawn out to one end of the memory block 2. Although illustration is omitted, even-numbered bit lines BLyL (e.g., BL10L, BL12L, BL14L, BL16L) are drawn out to the opposite side of the memory block 2 so that they are symmetric with respect to those shown in FIG. 6. Similarly, the bit line contacts 6 are provided in a symmetric manner with respect to those shown in FIG. 6.

Moreover, as shown in FIG. 7, eight bit line BLyU forms one bit line group BGiU in the memory cell array MA3 in the upper layer, in a similar way to FIG. 6. Among the bit line group BGiU, odd-numbered bit lines BLyU (e.g., BL11U, BL13U, BL15U, BL17U) are drawn out to one end of the memory block 2. Although illustration is omitted, even-numbered bit lines BLyU (e.g., BL10U, BL12U, BL14U, BL16U) are drawn out to the opposite side of the memory block 2 so that they are symmetric with respect to those shown in FIG. 7.

Formed at one end of one of the bit line groups BGiL is 16 bit line contacts 6 that are connected to the even-numbered bit lines BL in each of the memory cell arrays MA0-3 (although illustration is omitted, formed at the opposite end of one of the bit line groups BGiL is 16 bit line contacts 6 for each of the bit line groups BL1L).

These bit line contacts 6 are separately arranged in four regions 6A-6D. Each of the four regions 6A-6D is provided with the four bit line contacts 6. Each of the regions 6A-6D is provided with the probe member 100, and either one of the bit line contacts 6 is selectively contacted by the probe member 100.

For example, a bit line BL11L is connected to one bit line contact 6 (C11L) in the region 6D. Moreover, a bit line BL13L is connected to one bit line contact 6 (C13L) in the region 6C. Moreover, a bit line BL15L is connected to one bit line contact 6 (C15L) in the region 6A. A bit line BL17L is connected to one bit line contact (C17L) in the region 6B.

As shown in FIG. 7, a bit line BL11U is connected to one bit line contact 6 (C11U) of the region 6D. Moreover, a bit line BL13U is connected to one bit line contact 6 (C13U) in the region 6C. A bit line BL15U is connected to one bit line contact 6 (C15U) in the region 6A. Moreover, a bit line BL17U is connected to one bit line contact 6 (C17U) in the region 6B.

As described above, although four of the bit line contacts 6 are formed in the regions 6A-6D, these bit line contacts 6 are connected not only to bit line group BG1L and BG1U, but also to bit lines BL in the bit line groups BG2L, BG0L, BG2U, and BG0U formed in the upper and lower layers. As such, in the plural memory cell arrays MA0-3 laminated in this way, the even-numbered memory cell arrays MA0 and MA2 share the bit line contacts 6, and the odd-numbered memory cell arrays MA1 and MA3 similarly share the bit line contacts 6. Therefore, the number of the bit line contacts 6 may be reduced, and, as a whole, the memory device can be downsized.

[Others]

While embodiments of the present invention have been described, the present invention is not intended to be limited to the disclosed embodiments, and various other changes or additions may be made thereto, or any combinations thereof may be possible without departing from the spirit of the invention.

For example, in the above-described embodiment, the bit lines BL in each of the memory cell arrays MA0-3 share the bit line contacts 6. However, the present invention is not limited to this.

For example, the bit lines BL may be connected to separate bit line contacts 6, respectively. In this case, regarding word lines WL, a plurality of the word lines WL from a plurality of the memory cell arrays MA0-MA3 may share one of the word line contacts 7. In contrast, a plurality of the bit line BL share one bit line contact 6, while the word lines WL may be connected to word line contacts 7 independently.

Figure 8:
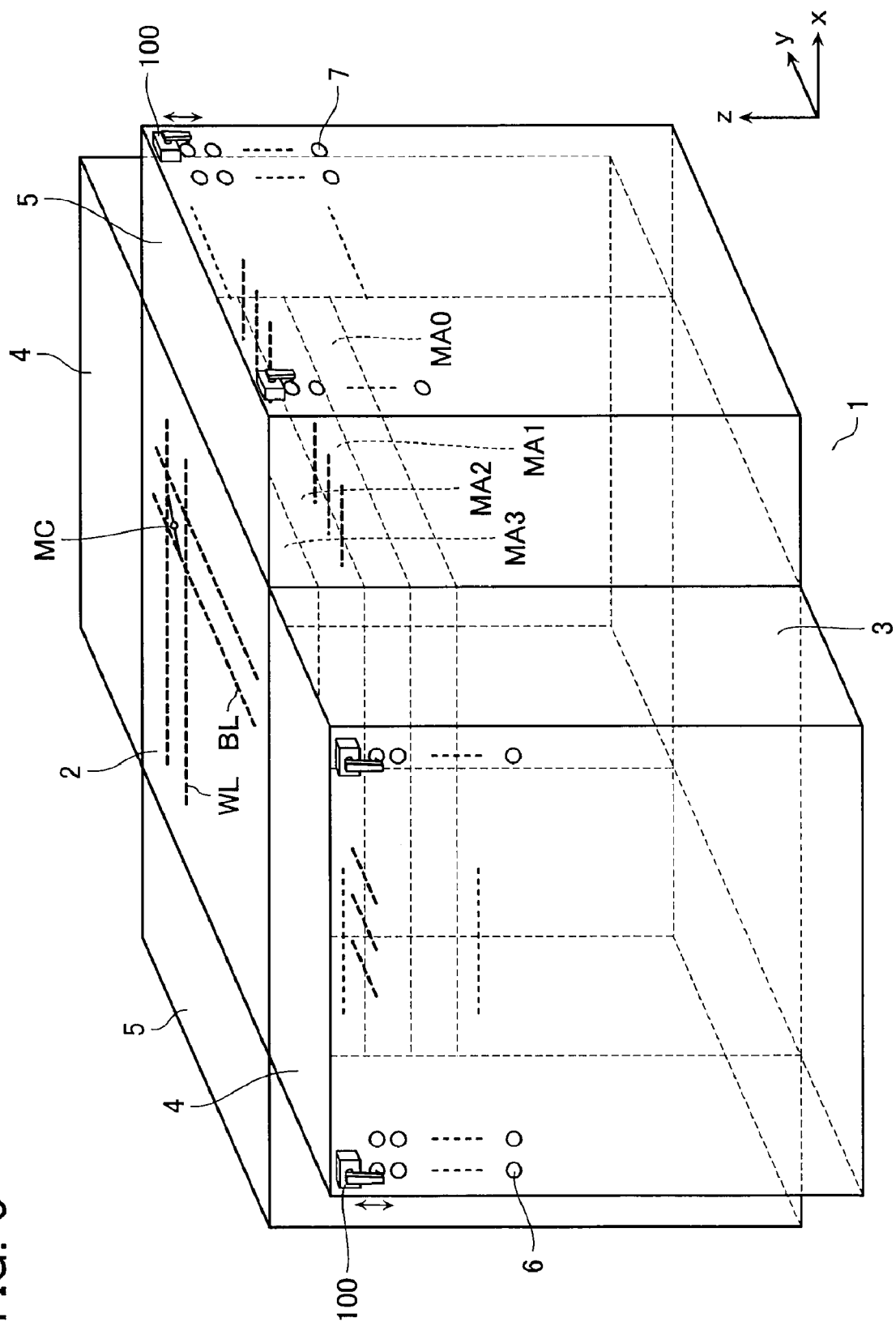
FIG. 8 illustrates a modification of the embodiment.

Moreover, in the above-described embodiment, a contact arrangement portion is formed on the top surface of the bit line contact region 4 and the word line contact region 5. However, instead of this, as shown in FIG. 8, a contact arrangement portion may be formed on the side surface of the bit line contact region 4 and the word line contact regions 5.

What is claimed is:

1. A semiconductor memory device comprising:
    a memory cell array having memory cells, a plurality of first wirings and a plurality of second wirings;
    a wiring pullout portion prepared for pulling out the first wirings and the second wirings;
    a contact arrangement portion formed to arrange a plurality of contacts on a plane, the contacts being connected to the first wirings or the second wirings; and
    a probe that can move along the plane to electrically contact with either of the contacts,
    a plurality of the memory cell arrays being laminated on a semiconductor substrate,
    the wiring pullout portion being configured to pull out odd-numbered ones of the first wirings or the second wirings from a first side of the memory cell array, and pull out even-numbered ones of the first wirings or the second wirings from a second side of the memory cell array, the second side being the opposite of the first side,
    and the contact arrangement portion comprising
    a first contact arrangement portion provided at the first side and formed to arrange a plurality of contacts electrically connected to odd-numbered ones of the first wirings or the second wirings on a plane, and
    a second contact arrangement portion provided at the second side and formed to arrange a plurality of contacts electrically connected to even-numbered ones of the first wirings or the second wirings on a plane.

2. The semiconductor memory device according to claim 1, wherein
    the plurality of the memory cell arrays share the contacts.

3. The semiconductor memory device according to claim 2, wherein
    even-numbered memory cell arrays among the plurality of the memory cell arrays share one of the contacts, while even-numbered memory cell arrays among the plurality of the memory cell arrays share another one of the contacts.

4. The semiconductor memory device according to claim 1, wherein
    the plane is parallel to the semiconductor substrate.

5. The semiconductor memory device according to claim 1, wherein
    the plane is a side surface of the wiring pullout portion.

6. The semiconductor memory device according to claim 1, wherein the contacts are provided in common for a plurality of the first wirings or a plurality of the second wirings.

7. The semiconductor memory device according to claim 1, wherein the memory cells are each positioned at respective intersections between the plurality of first wirings and the plurality of second wirings.

8. The semiconductor memory device according to claim 1, wherein each of the memory cells having a rectifier element and a variable resistance element connected in series, the resistance element being configured to be capable of having at least a first resistance value and a second resistance value higher than the first resistance value.

9. The semiconductor memory device comprising:
    a memory cell array having memory cells, a plurality of first wirings and a plurality of second wirings;
    a wiring pullout portion prepared for pulling out the first wirings and the second wirings;
    a contact arrangement portion formed to arrange a plurality of contacts on a plane, the contacts being connected to the first wirings or the second wirings; and
    a probe that can move along the plane to electrically contact with either of the contacts,
    wherein the wiring pullout portion includes
    a first wiring pullout portion configured to pull out odd-numbered ones of the first wirings from a first side of the memory cell array, and pullout even-numbered ones of the first wirings from a second side of the memory cell, the second side being the opposite side of the first side; and a second wiring pullout portion configured to pull out odd-numbered ones of the second wirings from a third side of the memory cell array, and pull out even-numbered ones of the second wirings from a fourth side of the memory cell, the fourth side being the opposite side of the third side.

10. The semiconductor memory device according to claim 9, wherein a plurality of the memory cell arrays are laminated on a semiconductor substrate.

11. The semiconductor memory device according to claim 10, wherein the plurality of the memory cell arrays share the contacts.

12. The semiconductor memory device according to claim 10, wherein even-numbered memory cell arrays among the plurality of the memory cell arrays share one of the contacts, while even-numbered memory cell arrays among the plurality of the memory cell arrays share another one of the contacts.

13. The semiconductor memory device according to claim 9, wherein the contact arrangement portion comprises a first contact arrangement portion formed to arrange a plurality of contacts electrically connected to the first wirings on a plane; and a second contact arrangement portion formed to arrange a plurality of contacts electrically connected to the second wirings on a plane.

14. The semiconductor memory device according to claim 9, wherein the plane is parallel to a semiconductor substrate.

15. The semiconductor memory device according to claim 9, wherein the plane is a side surface of the wiring pullout portion.

16. The semiconductor memory device according to claim 9, wherein the memory cells are each positioned at respective intersections between the plurality of first wirings and the plurality of second wirings.

17. The semiconductor memory device according to claim 9, wherein each of the memory cells having a rectifier element and a variable resistance element connected in series, the resistance element being configured to be capable of having at least a first resistance value and a second resistance value higher than the first resistance value.

* * * * *